United States Patent [19]
Chen et al.

[11] Patent Number: 5,366,850
[45] Date of Patent: Nov. 22, 1994

[54] SUBMICRON PLANARIZATION PROCESS WITH PASSIVATION ON METAL LINE

[75] Inventors: Kuang-Chao Chen; Shaw-Tzeng Hsia, both of Taipei, Taiwan, Prov. of China

[73] Assignee: Industrial Technology Research Institute, Hsinchu, Taiwan, Prov. of China

[21] Appl. No.: 46,776

[22] Filed: Apr. 14, 1993

[51] Int. Cl.$^5$ .............................................. G03F 7/26
[52] U.S. Cl. ..................................... 430/314; 430/317; 156/643; 156/646; 156/653; 437/228; 437/235; 437/238
[58] Field of Search ............... 430/311, 313, 314, 317; 156/643, 646, 653; 437/195, 225, 228, 235, 238

[56] References Cited
U.S. PATENT DOCUMENTS

| | | | |
|---|---|---|---|
| 4,676,867 | 6/1987 | Elkins | 156/643 |
| 4,775,550 | 10/1988 | Chu | 427/38 |
| 4,885,262 | 12/1989 | Ting | 437/231 |
| 5,003,062 | 3/1991 | Yen | 437/231 |
| 5,266,525 | 11/1993 | Morozumi | 437/195 |

*Primary Examiner*—Kathleen Duda
*Attorney, Agent, or Firm*—George O. Saile

[57] ABSTRACT

A passivation layer is provided over a conductive layer for contacting the active elements of semiconductor device structures in and on a semiconductor substrate. The passivation and conductive layers are patterned simultaneously. A thin oxide layer is deposited over the patterned conductive and passivation layers. The thin oxide layer is covered with a spin-on-glass layer to fill the valleys of the patterned conductive and passivation layers. The spin-on-glass layer is cured and then partially blanket anisotropically etched through its thickness and through the thin oxide layer to the underlying passivation layer at its highest point leaving spin-on-glass layer portions in the valleys. A top dielectric layer is deposited over the spin-on-glass layer to complete the planarization. Alternatively, an anisotropic oxide is deposited over patterned conductive lines of an integrated circuit. This anisotropic oxide deposits preferentially on the horizontal surfaces and relatively little on the vertical surfaces. The anisotropic oxide layer is covered with a spin-on-glass layer to fill the valleys of the patterned conductive layer. The spin-on-glass layer is cured and then partially blanket anisotropically etched through its thickness to the underlying anisotropic layer at its lowest point leaving spin-on-glass layer portions in the valleys. A top dielectric layer is deposited over the spin-on-glass layer to complete the planarization.

14 Claims, 9 Drawing Sheets

SUBMICRON PLANARIZATION PROCESS WITH PASSIVATION ON METAL LINE

BACKGROUND OF THE INVENTION

1. Field of the Invention

The invention relates to a method of planarizing an integrated circuit device, and more particularly, to a method of planarizing a submicron integrated circuit device, 0.5 microns and below, by purposefully forming an oxide overlying the metal layer for etchback purposes.

2. Description of the Prior Art

In conventional planarization of the metallurgy-dielectric layers of an integrated circuit, a metal is deposited and patterned by conventional lithography and etching techniques. Then the dielectric layer, which is typically silicon oxide material, is formed thereover. Often, a spin-on-glass material is applied, baked, and cured. The spin-on-glass and dielectric layers may now be etched back to planarize the metallurgy-dielectric layers, followed by a second oxide deposition. There are basic problems in the choice of thickness of the dielectric/spin-on-glass layers. The problems occur particularly where there are both wide spaces, greater than 0.6 microns, and narrow spaces, less than 0.6 microns. For example, in the areas where contact is planned to be made to the patterned metal, it is desired to have a thick dielectric layer to keep planarity, but the thick dielectric will cause voids in other areas. Referring to FIG. 1A, there is shown a portion of a partially completed integrated circuit in which device structures 12 have been formed on a semiconductor substrate 10. A thick dielectric layer 14 has been covered by a spin-on-glass layer 16. Dotted line 18 illustrates the profile of the integrated circuit after the spin-on-glass etchback Note that void 19 has been formed. Alternatively, if a thin dielectric layer is used, there is lost planarity in the contact area and etchback encroachment of the metal pattern, but there will not be a void problem in other surface areas of the integrated circuit. This is illustrated by the partially completed integrated circuit in FIG. 1B which is identical to that shown in FIG. 1A except that the dielectric layer 14 is thin and the resulting profile 18 after spin-on-glass etchback shows a loss of planarity.

A number of patents have addressed these and other problems in planarization. Co-pending U.S. patent application Ser. No. 07/941,161 filed on Sep. 3, 1992 to "Spin-On-Glass Integration Process" by K. C. Chen and S. T. Hsia describes an integration of a partial etchback siloxane spin-on-glass process with a silicate spin-on-glass process. Co-pending U.S. patent application Ser. No. 07/957,801 filed on Oct. 8, 1992 to "Inter-Metal Dielectric Planarization Process" by K. C. Chen and S. T. Hsia describes an integration of a plasma-enhanced silicon oxide deposition, a TEOS with ozone silicon oxide deposition, and a spin-on-glass deposition process. U.S. Pat. No. 5,003,062 to Yen involves a sandwich process in which the spin-on-glass material can be either silicate or siloxane. A vacuum degassing step is used. In U.S. Pat. No. 4,775,550 to Chu et al, the first insulating layer is very thick, on the order of 8000 to 10,000 Angstroms. This thickness causes voids in the submicron area. The aforementioned patent to Chu et al as well as U.S. Pat. Nos. 4,676,867 to Elkins et al and 4,885,262 to Ting et al each show spin-on-glass etchback processes with use of a sandwich dielectric. A satisfactory solution to the planarization problem must still be found for the 0.5 micron and below generation.

SUMMARY OF THE INVENTION

A principal object of the present invention is to provide an effective and very manufacturable method of planarizing a sub half-micron integrated circuit.

Another object of the present invention is to provide a method of planarizing an integrated circuit which will provide adequate thickness of oxide on metal for etchback purposes in certain areas which are high.

Yet another object of the present invention is to provide a method of planarizing an integrated circuit which does not result in voids between devices.

In accordance with the objects of this invention a new method of planarizing an integrated circuit is achieved. A passivation layer is provided over a conductive layer for contacting the active elements of semiconductor device structures in and on a semiconductor substrate. The passivation and conductive layers are patterned simultaneously. A thin oxide layer is deposited over the patterned conductive and passivation layers. The thin oxide layer is covered with a spin-on-glass layer to fill the valleys of the patterned conductive and passivation layers. The spin-on-glass layer is cured and then partially blanket anisotropically etched through its thickness and through the thin oxide layer to the underlying passivation layer at its highest point leaving spin-on-glass layer portions in the valleys. A top dielectric layer is deposited over the spin-on-glass layer to complete the planarization.

Alternatively, an anisotropic oxide is deposited over patterned conductive lines of an integrated circuit. This anisotropic oxide deposits preferentially on the horizontal surfaces and relatively little on the vertical surfaces. The anisotropic oxide layer is covered with a spin-on-glass layer to fill the valleys of the patterned conductive layer. The spin-on-glass layer is cured and then partially blanket anisotropically etched through its thickness to the underlying anisotropic layer at its lowest point leaving spin-on-glass layer portions in the valleys. A top dielectric layer is deposited over the spin-on-glass layer to complete the planarization.

BRIEF DESCRIPTION OF THE DRAWINGS

In the accompanying drawings forming a material part of this description, there is shown.

DESCRIPTION OF THE PREFERRED EMBODIMENTS

Figure 1A:
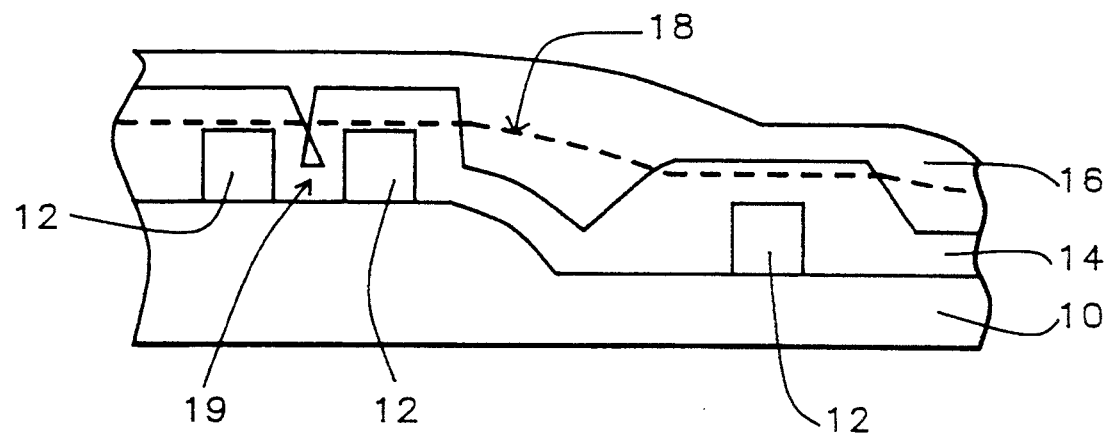
FIGS. 1A and 1B schematically illustrate in cross-sectional representation drawbacks of the conventional planarization process.
Figure 1B:
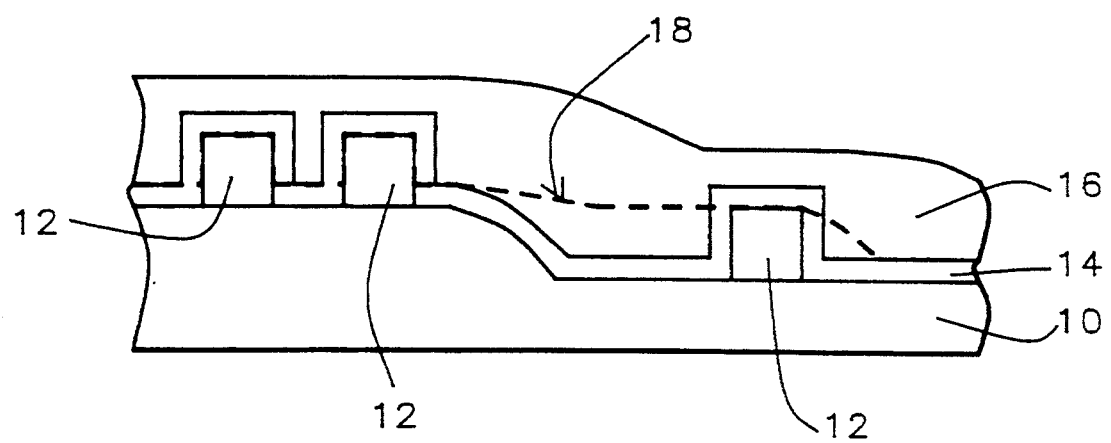
Figure 2:
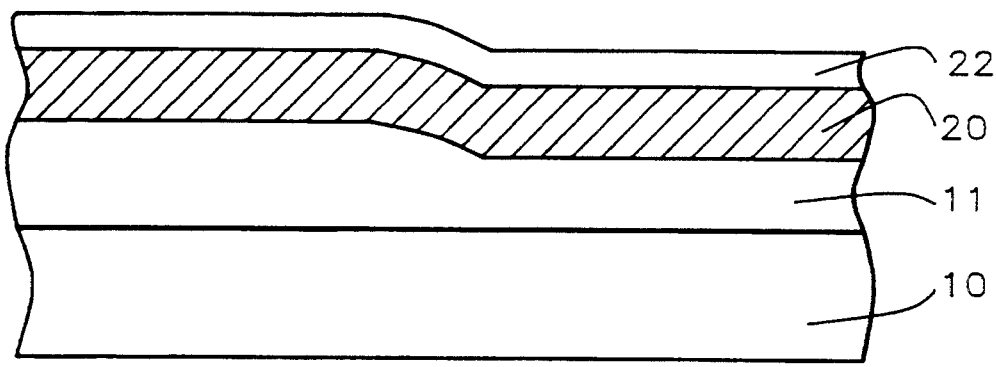
FIGS. 2 through 8 schematically illustrate in cross-sectional representation one preferred embodiment of the present invention.

Referring now more particularly to FIG. 2, there is shown a portion of a partially completed integrated circuit after deposition of the first metal layer 20 and a passivation layer 22. The semiconductor substrate 10 is preferably composed of monocrystalline silicon. Layer 11 contains the various device elements, such as gate electrodes and the like as well as dielectric and passivation layers underlying the first metal layer 20, formed as is conventional in the art. A passivation or insulating layer 22 is formed over the metal layer 20. Metal layer 20 may composed of Ti/TiN/AlSiCu/TiN, Ti/AlSiCu, Ti/TiW/AlSiCu/TiW, and the like. It is sputter deposited to a thickness of between about 5000 to 8000 Angstroms. Passivation layer 22 may be composed of oxide and is deposited by low temperature chemical vapor deposition (CVD), atmospheric pressure chemical vapor deposition (APCVD), or plasma enhanced chemical vapor deposition (PECVD) to a thickness of between about 4000 to 6000 Angstroms.

Figure 3:
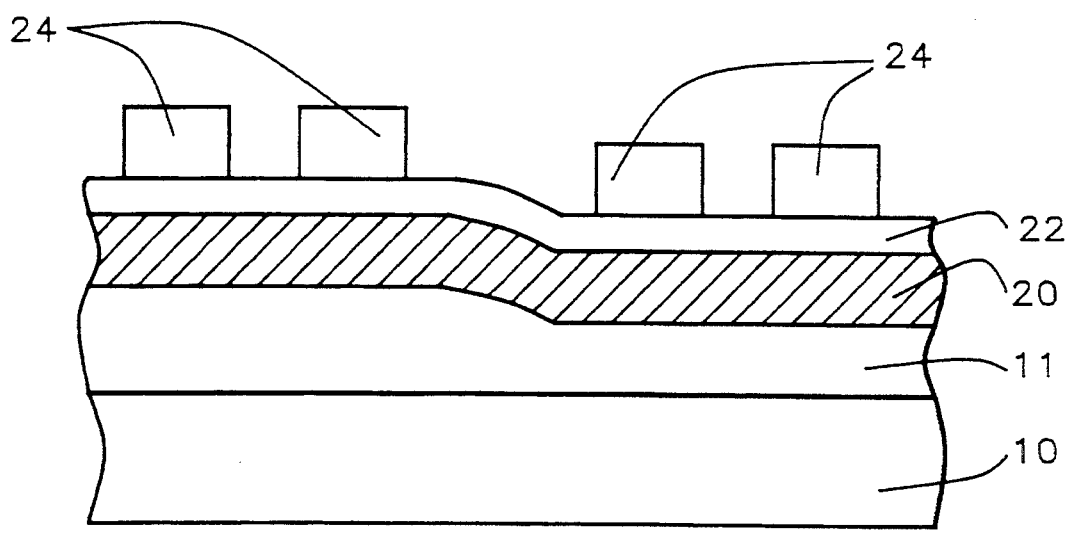

Referring now to FIG. 3, a photoresist layer 24 is deposited and patterned using conventional lithography and etching techniques to form a mask. The metal and oxide layers 20 and 22 are patterned as is conventional in the art and the photoresist layer is removed resulting in the pattern shown in FIG. 4A. Alternatively, the passivation layer 22 only is patterned using the photoresist as a mask, resulting in FIG. 4B. The patterned oxide is then used as a mask for the metal layer 20, resulting in the patterning shown in FIG. 4C.

Figure 4A:
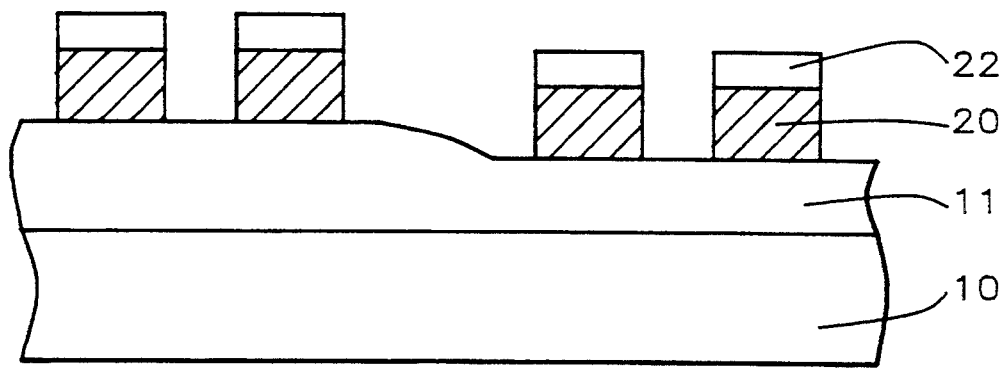
Figure 4B:
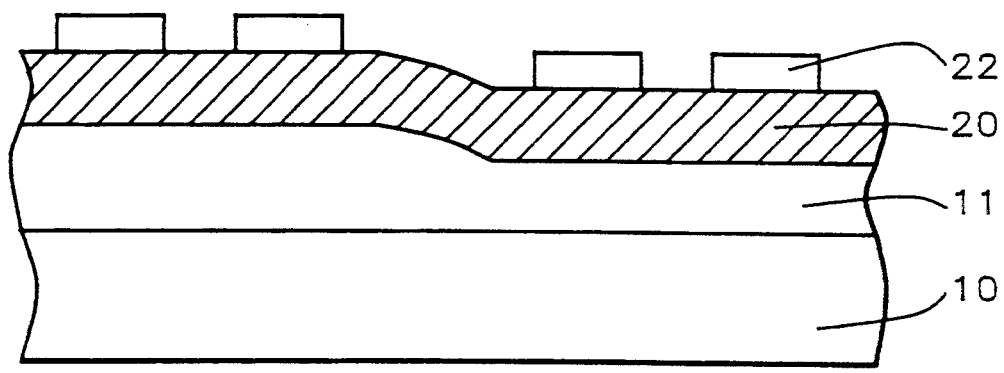
Figure 4C:
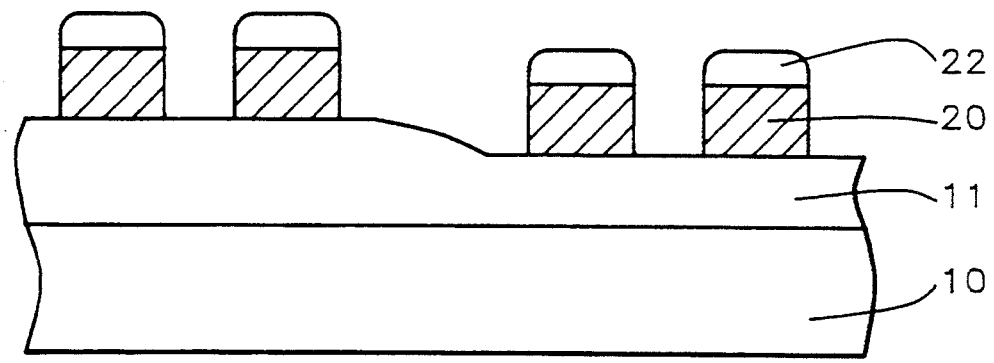
Figure 5A:
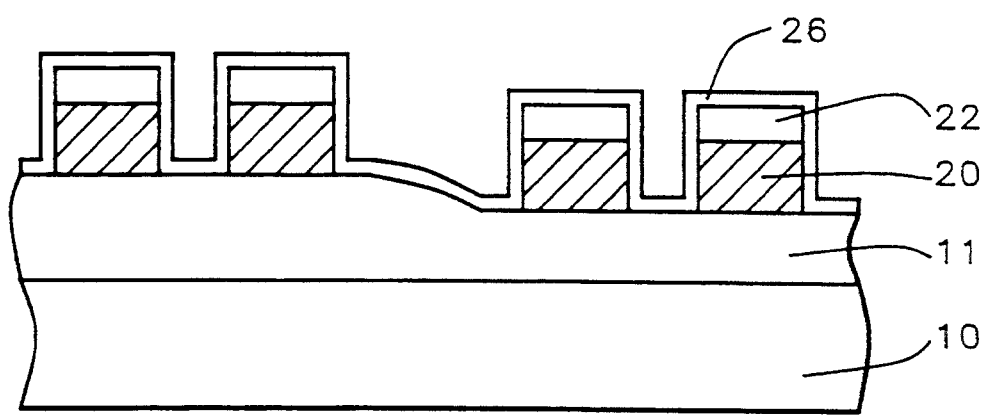
Figure 5B:
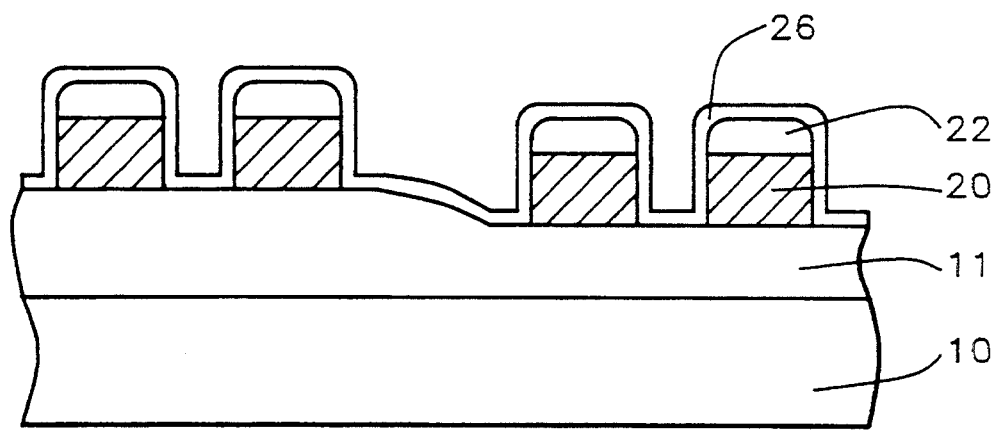

After the patterning of the metal and passivation layers, a thin oxide layer 26 is deposited over the wafer. This oxide layer may be composed of silicon dioxide deposited by CVD, APCVD, or PECVD to a preferred thickness of between about 1000 to 3000 Angstroms. The oxide layer 26 must be thick enough for the subsequent etchback step, but the sidewalls must be as thin as possible so that there will be adequate insulation, but the spaces between the patterned layers will not be too narrow. FIG. 5A shows the wafer after the deposition of oxide layer 26 where the metal and passivation layers were patterned together as illustrated in FIG. 4A. FIG. 5B shows the wafer after deposition of oxide layer 26 where the metal and passivation layers were patterned in separate steps as illustrated in FIGS. 4B and 4C. Henceforth, only the first patterning alternative will be illustrated because processing is identical for both alternatives.

Figure 6:
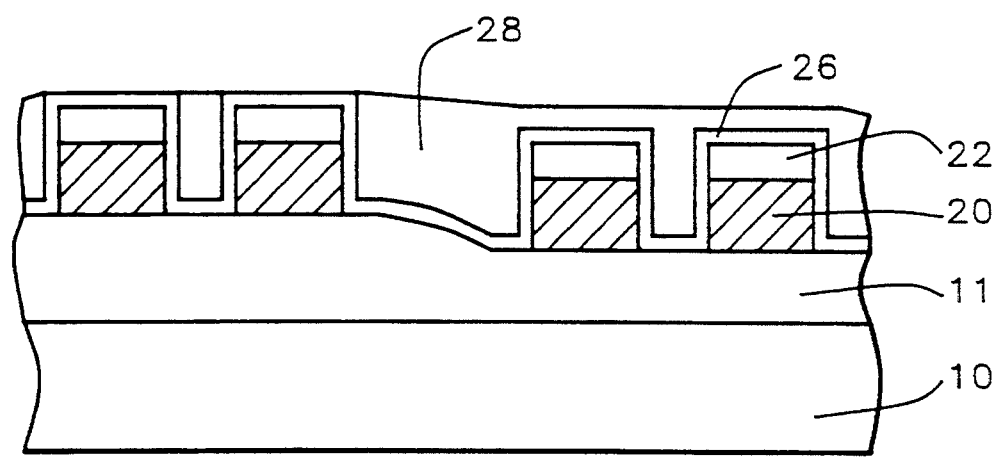

A spin-on-glass coating 28 is applied as illustrated in FIG. 6. The spin-on-glass material could be siloxane, such as Allied Signal 211, which is preferred, or alternatively, a silicate type spin-on-glass material. The spin-on-glass material suspended in the vehicle or solvent is deposited onto the semiconductor wafer surface and uniformly spread thereover by the action of spinning the wafer, for example, at 3500 revolutions per minute. The material fills the indentations in the integrated circuit wafer surface, that is planarization.

Most of the vehicle or solvent is driven off by a low temperature baking step. The wafer is heated to for example 80° C., 150° C., and 250° C.; or 80° C., 100° C., 150° C., 200° C., 250° C., and 300° C. for a duration of approximately two minutes each stage. The thickness of the spin-on-glass material is between about 2000 to 6000 Angstroms depending upon the particular type of spin-on-glass material, that is siloxane or silicate material that is used.

A curing step in a nitrogen or other inert atmosphere densifies as well as cures the spin-on-glass layer to a silicon oxide structure. There is a typically a stabilization time of less than about 60 minutes and preferably about 50 minutes, followed by a less than about 30 minute and preferably 15 minute ramp-up from 370° C. to 425° C. The curing step is preferably at least about 60 minutes.

Figure 7:
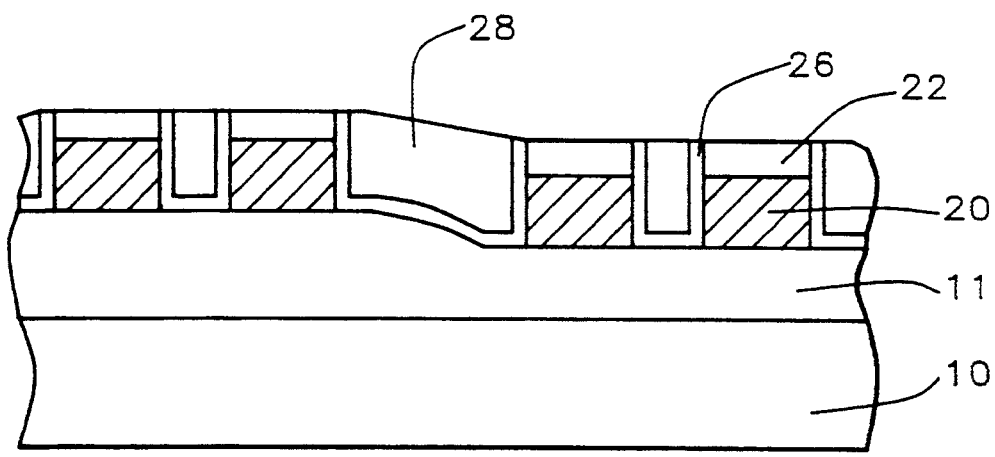

Referring now to FIG. 7, the spin-on-glass layer 28 is blanket anisotropically etched back using preferably $CF_4$ and $CHF_3$ gas at a pressure of between about 100 to 200 and preferably 150 mtorr and power of between about 200 to 300 and preferably 150 watts with an etch stop at layer 26. The selectivity between the spin-on-glass layer 28 and the thin oxide layer 26 is in the range from 0.8 to 1.0.

Figure 8:
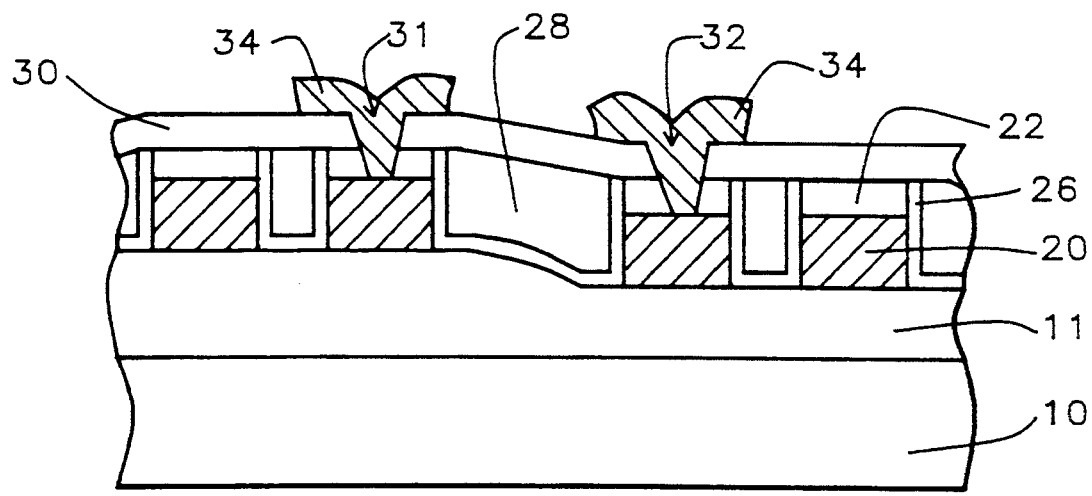

FIG. 8 illustrates the final deposition of oxide layer 30 using low temperature CVD, APCVD, or PECVD to a thickness of between about 4000 to 8000 Angstroms. This completes the planarization of the passivation layer on a metal line. The result of this very manufacturable method of the present invention is excellent planarity with no voids.

Openings can now be formed in layers 30, 28, and 26 to contact the first metallurgy layer 20. Note that the depth of via hole 32 is greater than the depth of via hole 31. The selectivity between silicon oxide 22 and the metal 20 is very good, so that overetching to be sure both contacts are open can be done safely. The next level of metallurgy 34 is then be deposited and patterned as is well understood by those skilled in the art.

Figure 9:
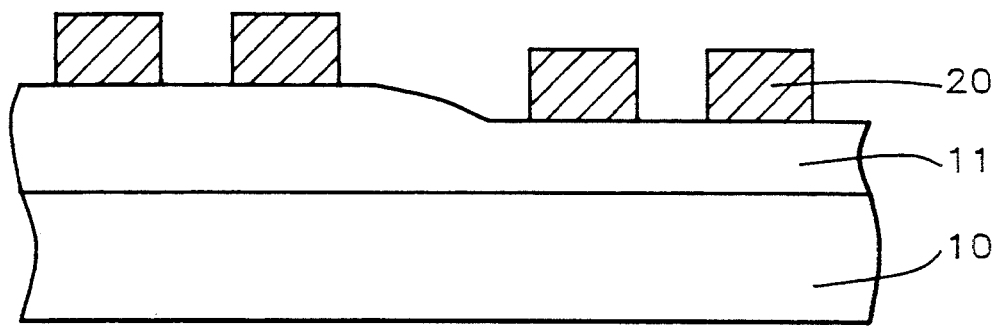
FIGS. 9 through 13 schematically illustrate in cross-sectional representation a second preferred embodiment of this invention.

FIGS. 9 through 13 illustrate a second embodiment of the present invention. Referring now to FIG. 9, there is shown a portion of a partially completed integrated circuit after patterning of the first metal layer 20. The semiconductor substrate 10 is preferably composed of monocrystalline silicon. As above, layer 11 contains the various device elements, such as gate electrodes and the like as well as dielectric and passivation layers underlying the first metal layer 20, formed as is conventional in the art. Metal layer 20 may be composed of TiN/AlSiCu/TiN and has a thickness of between about 8000 to 11000 Angstroms.

Figure 10:
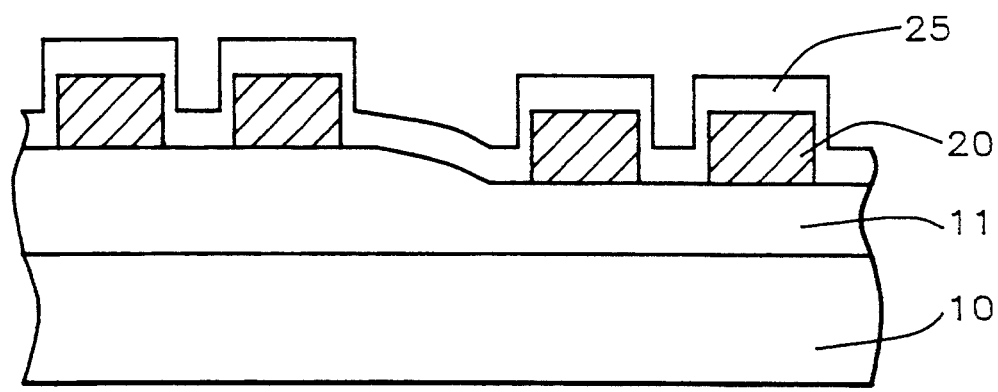

Referring now to FIG. 10, an anisotropic oxide layer 25 is deposited over the wafer. The step coverage of anisotropic oxide is different from that of conventional oxide. The anisotropic oxide deposits preferentially on the horizontal surfaces and relatively little on the vertical surfaces. This plasma TEOS oxide layer is deposited using the AMT-PR5000 chemical vapor deposition process which flows oxygen at 150 sccm and helium at 1000 sccm under a pressure of about 3.5 torr, power of about 400 watts, electrode spacing of 400 mils, TEOS temperature of 32.5° C., and wafer temperature of 360° C. An increase in the electrode spacing and a reduction in pressure leads to an increase in the ion bonding and lowers the surface mobility so that most of the oxide is deposited on the horizontal rather than on the vertical surfaces. The oxide layer 25 is deposited to a thickness of between about 3500 to 5000 Angstroms.

Figure 11:
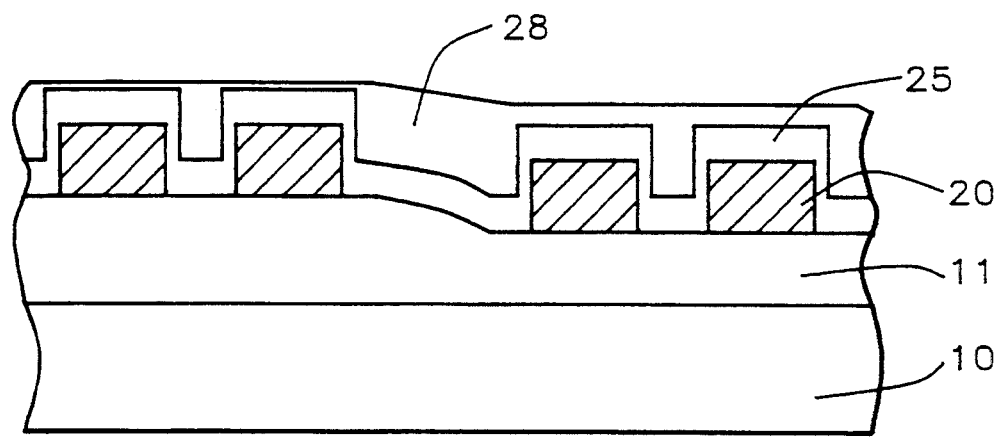

A spin-on-glass coating 28 is applied as illustrated in FIG. 11. The spin-on-glass material could be preferably siloxane, or alternatively silicate, as described above, and is deposited, baked, and cured as described above for the first preferred embodiment.

Figure 12:
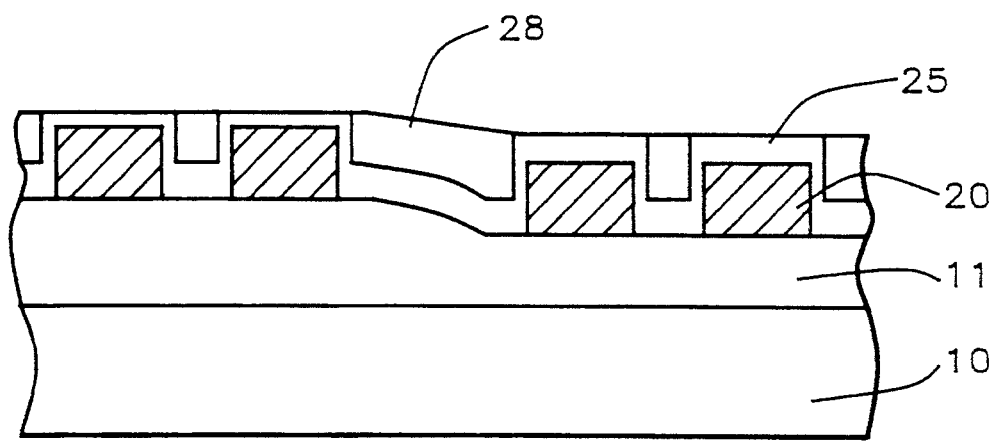

Referring now to FIG. 12, the spin-on-glass layer 28 is blanket anisotropically etched back as described above with an etch stop at layer 25. The selectivity between the spin-on-glass layer 28 and the anisotropic oxide layer 25 is in the range from 0.8 to 1.0.

Figure 13:
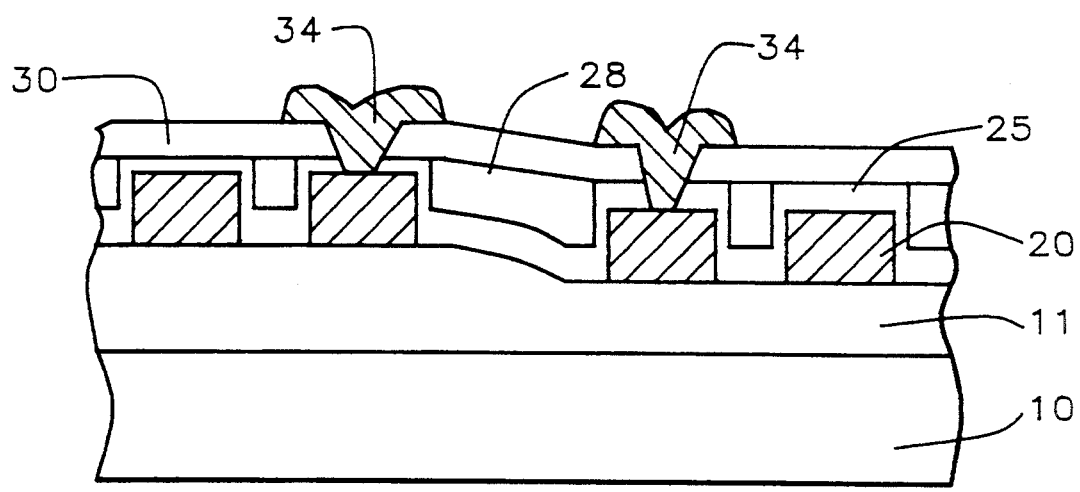

FIG. 13 illustrates the final deposition of passivation silicon oxide layer 30, which may be partially doped with boron and/or phosphorus, to a thickness of between about 4000 to 8000 Angstroms. This completes the planarization of the passivation layer on a metal line.

Openings can now be formed in layers 30 and 25 to contact the first metallurgy layer 20. As above, the selectivity between anisotropic oxide 25 and the metal 20 is very good, so that overetching to be sure contacts of different depths are open can be done safely. The next level of metallurgy 34 is then be deposited and patterned as is well understood by those skilled in the art.

While the invention has been particularly shown and described with reference to the preferred embodiments thereof, it will be understood by those skilled in the art that various changes in form and details may be made without departing from the spirit and scope of the invention.

What is claimed is:

1. The method of planarizing the passivation layer overlying a conductive layer in submicron integrated circuits comprising:
   providing semiconductor device structures in and on a semiconductor substrate;
   providing at least one conductive layer for contacting the active elements of said device structures;
   depositing a passivation layer overlying said conductive layer;
   patterning said conductive and said passivation layers wherein there are both wide spaces of greater than 0.6 microns and narrow spaces of less than 0.6 microns between said patterned conductive and passivation layers;
   depositing a thin oxide layer having a thickness of between about 1000 to 3000 Angstroms over said patterned conductive and passivation layers;
   covering said thin oxide layer with a spin-on-glass layer to fill the valleys of said patterned conductive and passivation layers and curing said spin-on-glass layer;
   etching backs said spin-on-glass layer through its thickness and said thin oxide layer through its thickness to the underlying said passivation layer at its highest point and leaving said spin-on-glass layer portions in said valleys; and
   depositing a top dielectric layer over said spin-on-glass layer to complete said planarizing.

2. The method of claim 1 wherein the said passivation layer is deposited to a thickness of between about 4000 to 6000 Angstroms.

3. The method of claim 1 wherein said spin-on-glass layer is deposited to a thickness of between about 2000 to 6000 Angstroms and said spin-on-glass material is siloxane type.

4. The method of claim 1 wherein said spin-on-glass material is silicate type and the curing conditions include curing in a nitrogen atmosphere for preferably at least 60 minutes.

5. The method of claim 1 wherein said etching back of said spin-on-glass layer and said thin oxide layer uses $CF_4$ and $CHF_3$ gases at a pressure of between about 100 to 200 mtorr and a power of between about 200 to 300 watts and wherein the selectivity between said spin-on-glass layer and said thin oxide layer is in the range from 0.8 to 1.0.

6. The method of claim 1 wherein said top dielectric deposition is an oxide deposited to a thickness of between about 4000 to 8000 Angstroms.

7. The method of claim 1 wherein said patterning of said conductive and said passivation layers is performed in one step wherein a single photoresist mask is used to pattern both said conductive layer and said passivation layer at the same time.

8. The method of claim 1 wherein said patterning of said conductive and said passivation layers is performed in two steps wherein in the first step said passivation layer is patterned using a photoresist mask and in the second step said conductive layer is patterned using the said patterned passivation layer as a mask.

9. The method of planarizing the passivation layer overlying a conductive layer in submicron integrated circuits comprising:
   providing semiconductor device structures in and on a semiconductor substrate;
   providing at least one patterned conductive layer for contacting the active elements of said device structures wherein there are both wide spaces of great than 0.6 microns and narrow spaces of less than 0.6 microns within said patterned conductive layer;
   anisotropically depositing a silicon oxide layer to a thickness of between about 3500 to 5000 Angstroms over said patterned conductive layer wherein said anisotropic silicon oxide deposits preferentially on the horizontal surfaces and relatively little on the vertical surfaces of said patterned conductive layer;
   covering said anisotropic oxide layer with a spin-on-glass layer to fill the valleys of said patterned conductive layer and curing said spin-on-glass layer;
   etching back said spin-on-glass layer through its thickness to the underlying said anisotropic oxide layer and leaving said spin-on-glass layer portions in said valleys and etching back said anisotropic oxide layer and leaving a portion of said anisotropic oxide layer overlying all portions of said patterned conductive layer; and
   depositing a top dielectric layer over said spin-on-glass layer to complete said planarizing.

10. The method of claim 9 wherein the said anisotropic oxide layer is deposited by plasma enhanced chemical vapor deposition using oxygen and TEOS/helium gases flowed at about 150 and 1000 sccm, respectively, electrode spacing of about 400 mils, pressure of about 3.5 torr, and a power of about 400 watts.

11. The method of claim 9 wherein said spin-on-glass layer has a thickness of between about 2000 to 6000 Angstroms and said spin-on-glass material is siloxane type.

12. The method of claim 9 wherein said spin-on-glass material is silicate type and the curing conditions include curing in a nitrogen atmosphere for preferably at least 60 minutes.

13. The method of claim 9 wherein said etching back of said spin-on-glass layer and said anisotropic oxide layer uses $CF_4$ and $CHF_3$ gases at a pressure of between about 100 to 200 mtorr and power of between about 200 to 300 watts and wherein the selectivity between said spin-on-glass layer and said anisotropic oxide layer is in the range from 0.8 to 1.0.

14. The method of claim 9 wherein said top dielectric deposition is an oxide deposited to a thickness of between about 4000 to 8000 Angstroms.

* * * * *